United States Patent
Oh et al.

(10) Patent No.: US 7,394,711 B2
(45) Date of Patent: Jul. 1, 2008

(54) MULTI-PORT SEMICONDUCTOR MEMORY DEVICE AND METHOD FOR ACCESSING AND REFRESHING THE SAME

(75) Inventors: Chi-Sung Oh, Gyeonggi-do (KR); Ho-Cheol Lee, Gyeonggi-do (KR); Nam-Jong Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 11/616,846

(22) Filed: Dec. 27, 2006

(65) Prior Publication Data

US 2007/0171755 A1 Jul. 26, 2007

(30) Foreign Application Priority Data

Dec. 22, 2005 (KR) ...................... 10-2005-0127818

(51) Int. Cl.
*G11C 7/00* (2006.01)
(52) U.S. Cl. .............. 365/222; 365/230.03; 365/230.05
(58) Field of Classification Search ............ 365/185.25
See application file for complete search history.

(56) References Cited

U.S. PATENT DOCUMENTS

| | | | |
|---|---|---|---|
| 4,796,232 A | * | 1/1989 | House ................... 365/189.03 |
| 4,809,233 A | | 2/1989 | Takemae |
| 4,939,695 A | | 7/1990 | Isobe et al. |
| 4,943,960 A | | 7/1990 | Komatsu et al. |
| 5,315,557 A | | 5/1994 | Kim et al. |
| 5,373,475 A | * | 12/1994 | Nagase ....................... 365/222 |
| 5,414,666 A | * | 5/1995 | Kumagai et al. ............ 365/222 |
| 5,844,856 A | * | 12/1998 | Taylor ................... 365/230.05 |
| 6,381,188 B1 | | 4/2002 | Choi et al. |
| 6,501,699 B2 | * | 12/2002 | Mizugaki ..................... 365/222 |
| 7,180,808 B2 | * | 2/2007 | Choi et al. .................. 365/222 |
| 2005/0024969 A1 | | 2/2005 | Kim |

\* cited by examiner

*Primary Examiner*—Tan T. Nguyen
(74) *Attorney, Agent, or Firm*—Marger Johnson & McCollom, P.C.

(57) ABSTRACT

A semiconductor memory device and a method therefor for changing an access right to access a shared memory area according to an external command and a refresh mode is provided. In one embodiment, the semiconductor memory device includes a plurality of input/output ports for inputting command signals for first or second mode refresh operation, a memory array divided into a plurality of different memory areas including a shared memory area that is accessible via at least two of the plurality of input/output ports, and a grant control block for assigning an access right to access the shared memory area in response to an external command signal. The grant control block may also generate grant control signals for preferentially assigning the access right to access the shared memory area to the input/output port for inputting the command signals for the first mode refresh operation.

20 Claims, 11 Drawing Sheets

MULTI-PORT SEMICONDUCTOR MEMORY DEVICE AND METHOD FOR ACCESSING AND REFRESHING THE SAME

BACKGROUND

1. Technical Field

The present invention relates to a multi-port semiconductor memory device and a method for accessing and refreshing the same, and more particularly, to a multi-port semiconductor memory device and a method of performing efficient refresh and access right assignment on a shared memory area of the memory device.

2. Discussion of Related Art

DRAM (dynamic random access memory) is widely used as a semiconductor memory device for increasing integration density in a semiconductor substrate. In DRAM, one memory cell includes one select transistor and one data storing capacitor. Because charges are leaked through the storage capacitor and the select transistor, DRAM requires periodic refreshing to recharge the charges in its cells. Accordingly, semiconductor memory devices such as a DRAM need refresh control circuits for controlling operations related to refreshing the memory cells.

There are many known methods that are widely used to refresh memory cells in semiconductor memory devices such as DRAM.

First, in an RAS only refresh ("ROR") method, cells are refreshed by enabling a row address strobe (RAS) signal while a column address strobe (CAS) signal is kept at a precharge level. During this refresh operation, external refresh addresses need to be provided to a memory device, and address buses connected to the memory device are not allowed to be used for other purposes.

Another type of refresh method is an automatic refresh method, also known as a CAS Before RAS ("CBR") refresh method. In the previous mode of operation, an external RAS signal is enabled when memory cells are accessed in preference to an external CAS signal. On the other hand, in the automatic refresh method, a CAS signal is enabled in preference to an RAS signal to recognize a refresh mode. That is, the CAS signal is generated at a low level prior to the RAS signal being generated a low level. In this method, refresh addresses are internally generated by a refresh address counter in the DRAM and the refresh address counter cannot be externally controlled.

At present, DRAM provides a self refresh mode to reduce the amount of current consumed in the refresh operation. A start cycle in this mode is the same as that in the automatic refresh method. Specifically, when CAS and RAS signals are both kept at an active state (e.g., a low level) during a predetermined period of time (e.g., 100 μm), a self refresh operation is performed in which data stored in all memory cells are read and amplified during a given refresh period using a refresh timer and are then restored in the memory cells. However, during this operation, normal operations (e.g., read and write operations) are interrupted so that the refresh operation is not disrupted. In the self refresh method, a refresh timer and a refresh address counter in the DRAM automatically perform required refresh operations using their clock signals without using external clock signals. These refresh techniques are disclosed in U.S. Pat. Nos. 4,809,233, 4,939,695, 4,943,960, and 5,315,557.

This does not create a problem when the semiconductor memory device performing the refresh operation includes only one input/output port having various sets of input/output pins to communicate with an external processor. That is, in a single-port memory device, all memory banks constituting a memory array are accessed via the one port. Thus, the refresh operation can be performed according to command signals that are input via the port.

As mobile technology has recently been further developed, multi-port semiconductor memory devices having dual-ports or multiple ports has been introduced to meet the demands of this new technology. In multi-port semiconductor memory devices, communication is performed via a plurality of processors, and a plurality of memory cells can be simultaneously accessed via a plurality of input/output ports. However, unlike the single port devices discussed above, multi-port semiconductor memory devices may encounter problems during refresh operations because they include shared memory areas that are accessible via the plurality of input/output ports. For example, when a self refresh operation is performed through an input/output port having an access right to access the shared memory area, the shared memory area cannot be accessed via another input/output port without current access privileges. Thus, there is a need for efficient refresh and access right assignment via each input/output port.

SUMMARY

The present invention is directed to providing a multi-port semiconductor memory device and a method or using the same to help solve the aforementioned problems. Thus, objects of the present invention are to provide a multi-port semiconductor memory device capable of efficiently refreshing a shared memory area and changing an access right to access a shared memory area according to a refresh mode.

In accordance with an exemplary embodiment, the present invention provides a semiconductor memory device including a plurality of input/output ports for inputting command signals for first or second mode refresh operations, a memory array divided into a plurality of different memory areas including a shared memory area that is accessible via at least two of the plurality of input/output ports, and a grant control block for assigning an access right to access the shared memory area in response to an external command signal. The grant control block may also generate grant control signals for preferentially assigning the access right to access the shared memory area to the input/output port for inputting the command signals for the first mode refresh operation.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION

Figure 1:
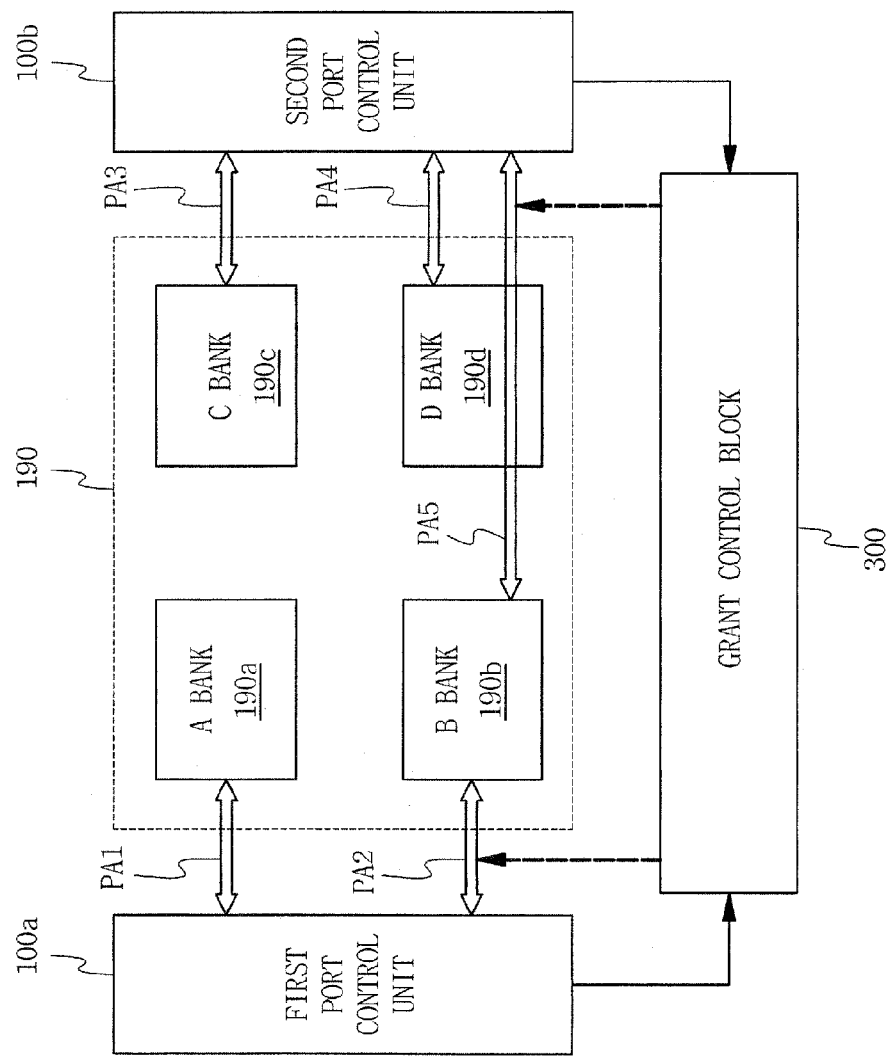
FIG. 1 is a schematic block diagram of a semiconductor memory device according to an embodiment of the present invention.

The present invention will now be described more fully hereinafter with reference to the accompanying drawings, in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. FIG. 1 is a schematic block diagram of a semiconductor memory device according to an embodiment of the present invention.

As shown in FIG. 1, a semiconductor memory device according to an embodiment of the present invention is a dual-port semiconductor memory device, which is one example of a multi-port semiconductor memory device. The device includes a memory array 190, a first port control unit 100a for controlling signals input/output via a first input/output port, a second port control unit 100b for controlling signals input/output via a second input/output port different from the first input/output port, and a grant control block (GCB) 300.

The memory array 190 is divided into a plurality of different memory areas. For the purposes of this embodiment, it is assumed that the memory array is divided into four memory banks 190a, 190b, 190c, and 190d, as in a typical semiconductor memory device. Further, the four memory banks 190a, 190b, 190c, and 190d may be classified into first, second, and third memory areas. It is also assumed that an access path PA1 is set so that the first memory area, the A bank 190a, can be accessed only via the first input/output port. It is further assumed that access paths PA3 and PA4 are set so that the second memory area, C and D banks 190c and 190d, are accessed only via the second input/output port. Finally, it is assumed that access paths PA2 and PA5 are set so that the third memory area, the B bank 190b, can be accessed via the first input/output port and the second input/output port. The access paths PA2 and PA5 to the third memory area, the B bank 190b, may further be controlled by the grant control block 300 as indicated by the dashed lines. In the memory array 190, other access paths and memory areas may be present.

The first port control unit 100a may include a first input/output port, and control circuits for controlling command signals, address signals, data signals, and the like that are input/output via the first input/output port.

The second port control unit 100b may include a second input/output port, and control circuits for controlling command signals, address signals, data signals, and the like that are input/output via the second input/output port.

The grant control block 300 assigns an access right (or grant) to access the shared memory area in response to an external command signal. The grant control block 300 generates grant control signals for preferentially assigning an access right (grant) to access the shared memory area to an input/output port based on which command signals for a first mode refresh operation are input. That is, the grant control block 300 assigns the access right to the first input/output port or the second input/output port by controlling the access paths PA2 and PA5 of the shared memory area 190b with the grant control signals. The access paths PA2 and PA5 may include a command signal path, a data path, and an address path between the input/output ports and the shared memory area.

When a refresh operation is performed in a second mode, the grant control block 300 generates a grant control signal to assign an access right to access the shared memory area to another input/output port on which the refresh operation is performed in the first mode as set out by the external command signal. Here, the first mode may be an automatic refresh operation mode, and the second mode may be a self refresh mode.

Figure 2:
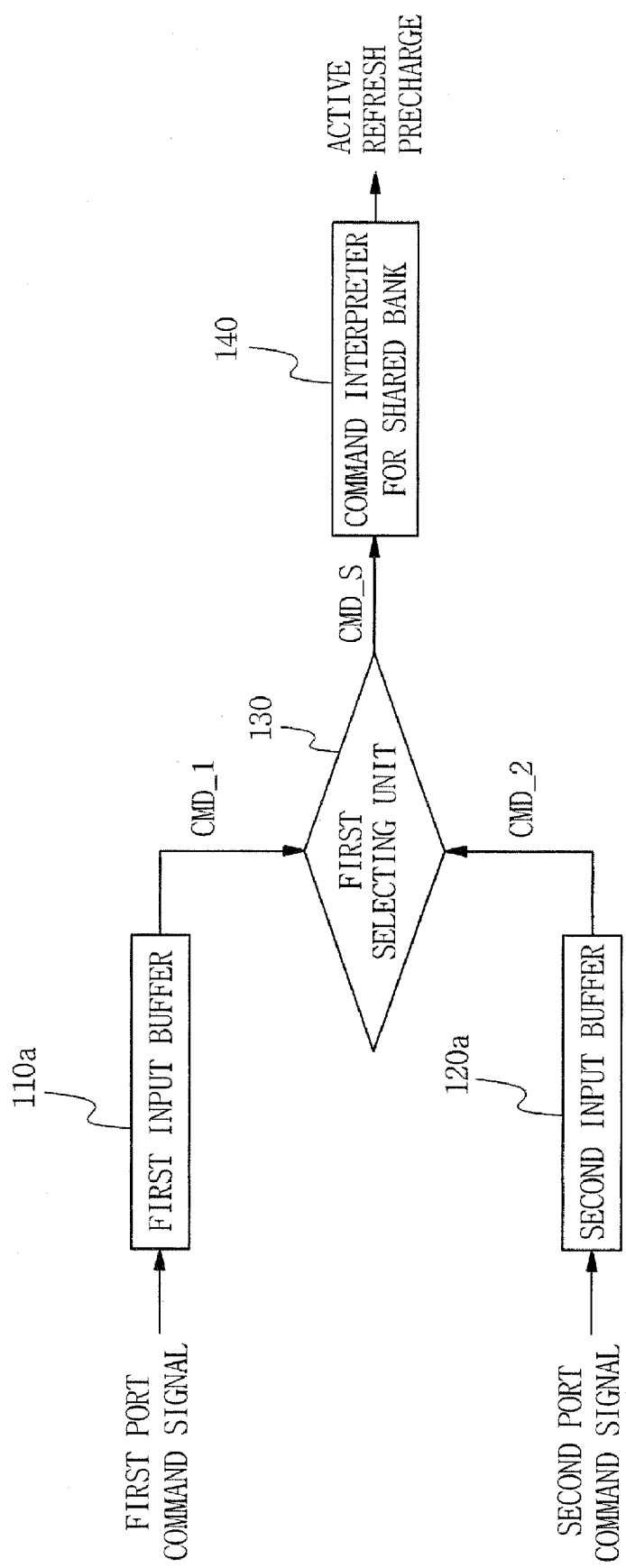
FIG. 2 is a block diagram of a command path to a shared memory area in FIG. 1.

FIG. 2 is a block diagram illustrating a command path for command signals constituting the access paths PA2 and PA5 to the shared memory bank illustrated in FIG. 1.

As shown in FIG. 2, a first command signal CMD_1 input via a first input/output port is buffered in a first input buffer 110a and transmitted to a first selecting unit 130. Further, a second command signal CMD_2 input via a second input/output port is buffered in a second input buffer 120a and transmitted to the first selecting unit 130. The first selecting unit 130 selects either the first command signal CMD_1 or the second command signal CMD_2 in response to the grant control signal generated by the grant control block 300 and transmits the selected command signal CMD_S to a command interpreter 140 for the shared bank, the B bank. In this manner, the first selecting unit 130 determines which command signal from the input/output ports is used to operate the shared memory bank.

The command interpreter 140 for the B bank analyzes received command signals. That is, the command interpreter 140 determines whether the received command signal is an active signal ACTIVE, a precharge signal PRECHARGE, or a refresh signal REFRESH and transmits then transmits the received signal. Thereafter, operations according to the command signals are performed. The operation according to the command signals is the same as in typical DRAM circuits.

Figure 3:
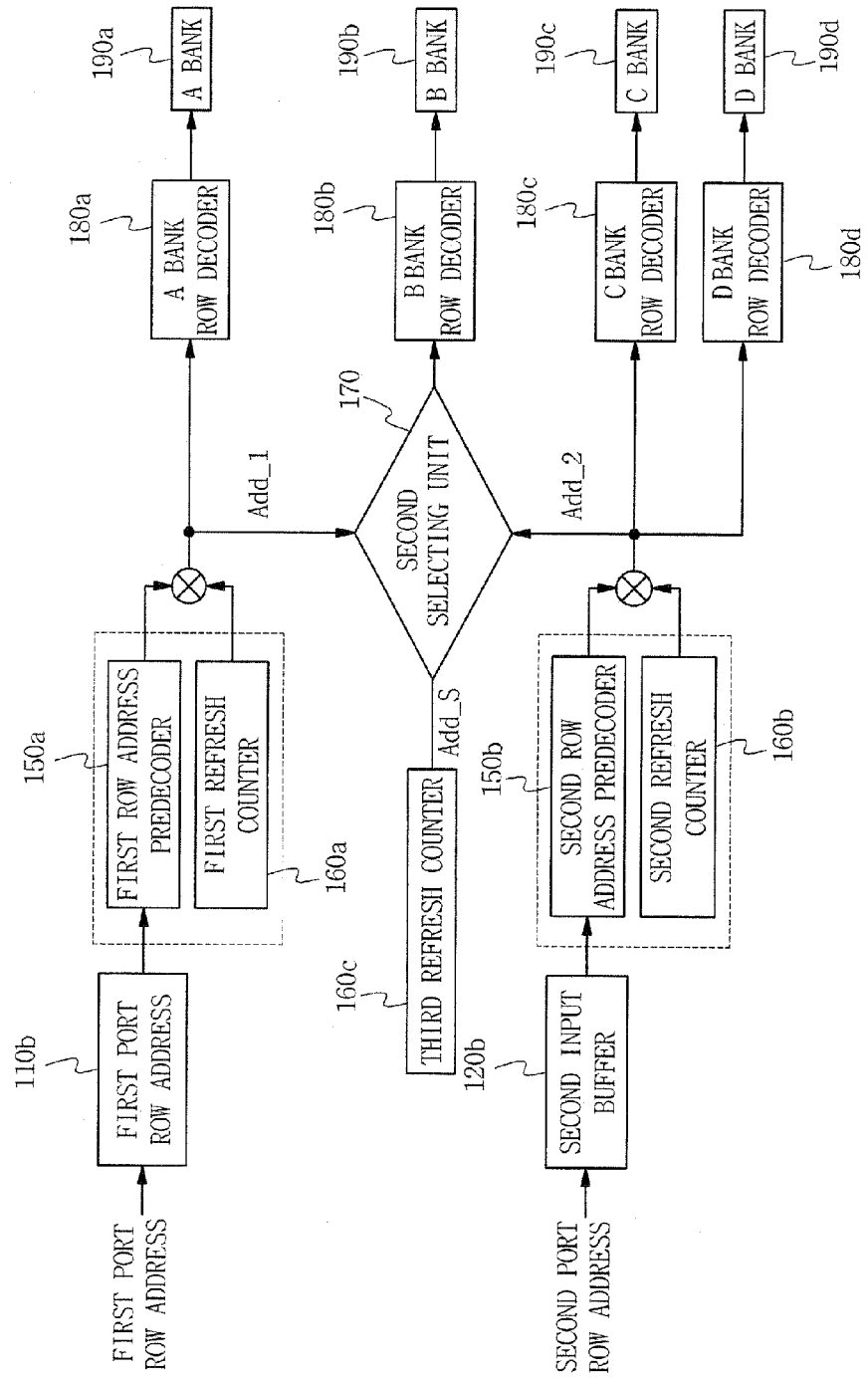
FIG. 3 is a block diagram of a row address path in FIG. 1.

FIG. 3 is a schematic block diagram illustrating a row address path and a refresh path to each memory bank illustrated in FIG. 1.

As shown in FIG. 3, a row address path and a refresh path in a semiconductor memory device according to an embodiment of the present invention include first and second input buffers 110b and 120b, first and second row address predecoders 150a and 150b, first to third refresh counters 160a, 160b, and 160c, a second selecting unit 170, A to D bank row decoders 180a, 180b, 180c, and 180d, and A to D memory banks 190a, 190b, 190c, and 190d.

The first input buffer 110b buffers a row address input via the first input/output port and transmits the row address to the first row address predecoder 150a. The row address input to the first input buffer 110b may be a row address for the A bank or a row address for the B bank that is a shared bank. The first input buffer 110b has the same name as the first input buffer 110a of FIG. 2. However, the first input buffer 110a of FIG. 2 is a command buffer, and the first input buffer 110b is an address input buffer. The first input buffers 110a and 110b may have the same circuit structure and may be composed of one buffer circuit.

The second input buffer 120b buffers a row address input via the second input/output port and transmits the row address to the second row address predecoder 150b. The row address input to the second input buffer 120b may be a row address for the C bank, the D bank, or the B bank, which is the shared bank. The second input buffer 120b has the same name as the second input buffer 120a of FIG. 2. However, the second input buffer 120a of FIG. 2 is a command buffer, and the second input buffer 120b is an address input buffer. The second input buffers 120a and 120b may have the same circuit structure and may be composed of one buffer circuit. The buffer circuits 110b and 120b may be generally implemented by circuits that are well known to those skilled in the art.

The first row address predecoder 150a predecodes the row address received via the first input buffer 110b. The first row address predecoder 150a is also composed of a circuit that is well known to those skilled in the art.

The second row address predecoder 150b predecodes the row address received via the second input buffer 120b. The second row address predecoder 150b is also composed of a circuit that is well known to those skilled in the art.

The A bank row decoder 180a decodes the row address for the A bank received via the first row address predecoder 150a and enables a word line connected to a desired memory cell in the A bank 190a.

The B bank row decoder 180b decodes the row address for the B bank received via the first row address predecoder 150a or the second row address predecoder 150b and enables a word line connected to a desired memory cell in the B bank 190b.

Each of the C bank row decoder 180c and the D bank row decoder 180d decodes the row address for the C bank or the row address for the D bank received via the second row address predecoder 150b, and enables a word line connected to a desired memory cell in the C bank 190c or the D bank 190d.

The first refresh counter 160a is for generating a refresh address of the A bank 190a and is normally composed of an m-bit ripple counter.

The second refresh counter 160b is for generating a refresh address of the C bank 190c and D the bank 190d and is normally composed of an m-bit ripple counter.

The third refresh counter 160c is for generating a refresh address of the B bank 190b that is the shared memory bank, and may be composed of an m-bit ripple counter. Providing the third refresh counter 160c that is a separate refresh counter dedicated for the B bank 190b instead of refresh counters for the input/output ports (e.g., the first and second refresh counters 160a and 160b) in order to refresh the B bank 190b is for preventing overlapping or skipping of the refresh of a specific address. For example, if it is assumed that the first input/output port has an access right (grant) to access the B bank and all memory banks are in an automatic refresh mode, when the self refresh command is input via the first port, the A bank 190a continues to perform self refresh. However, according to an embodiment of the present invention, the access right (grant) is changed and the B bank 190b is refreshed in an automatic refresh mode via the second input/output port. If a refresh address signal is input via the second refresh counter 160b, the B bank is not correctly refreshed and a memory cell may be refreshed in an overlapping manner or not refreshed. To solve this problem, the third refresh counter 160c is preferably separate.

The second selecting unit 170 operates in response to the grant control signals generated at the grant control block 300 of FIG. 1. The second selecting unit 170 selects one of the B bank address passing through the first row address predecoder 150a and the B bank address passing through the second row address predecoder 150b and sends the selected B bank address to the B bank row decoder 180b. In other words, the second selecting unit 170 determines which row address from the input/output ports is to be sent to the B bank row decoder 180b, and controls the address path to effectuate this selection. When the refresh operation is performed, the second selecting unit 170 does not select the refresh address from the first refresh counter 160a or the second refresh counter 160b, but rather transmits the refresh address from the third refresh counter 160c to the B bank row decoder 180b.

The column address path can be easily established by those skilled in the art by referring to FIG. 2 and thus a description thereof will be omitted. The column address path will be more easily established since a refresh counter is not required.

While examples of the refresh control circuits include the first input buffers 110a and 110b, the second input buffers 120a and 120b, and the refresh counters 160a, 160b, and 160c as described above, additional refresh control circuits may be provided, such as a self refresh timer composed of a counter for generating a self refresh period pulse signal corresponding to a given self refresh period in response to a self refresh mode signal. Further, all circuits needed for refresh, including circuits for generating a refresh enable signal in a refresh mode, may be provided, and a control circuit for controlling the entry into a self refresh mode may be further provided.

Figure 4:
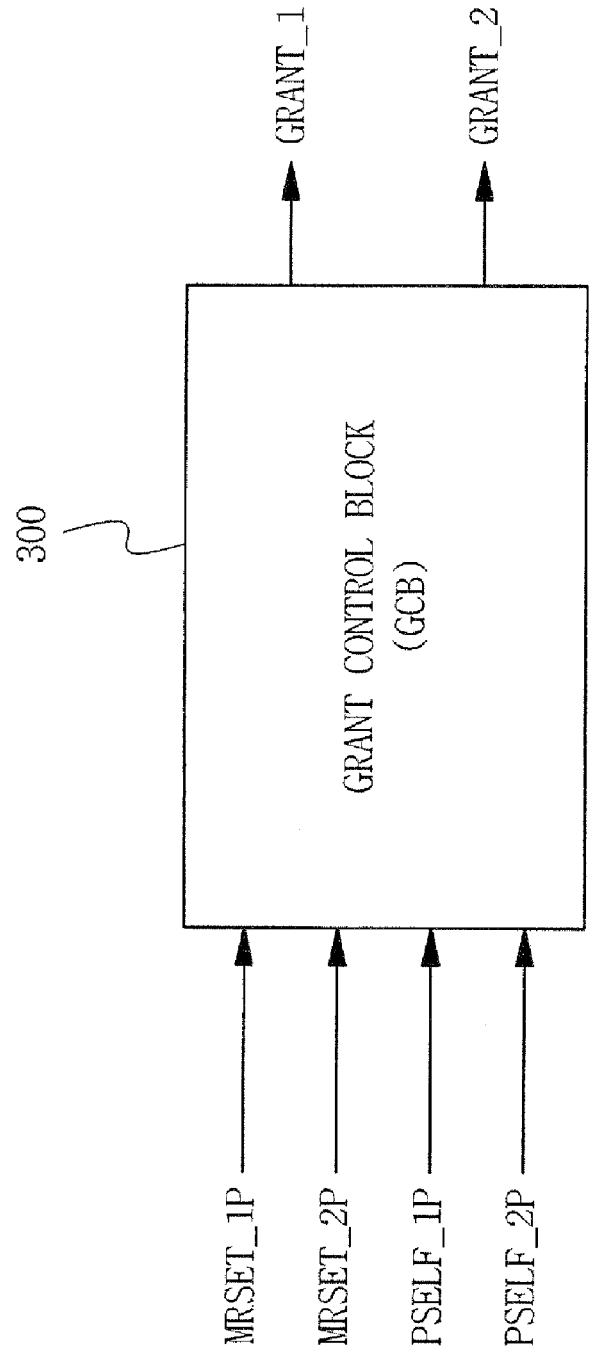
FIG. 4 is a block diagram of the grant control block illustrated in FIG. 1.

FIG. 4 is a block diagram of the grant control block 300 illustrated in FIG. 1.

Figure 7:
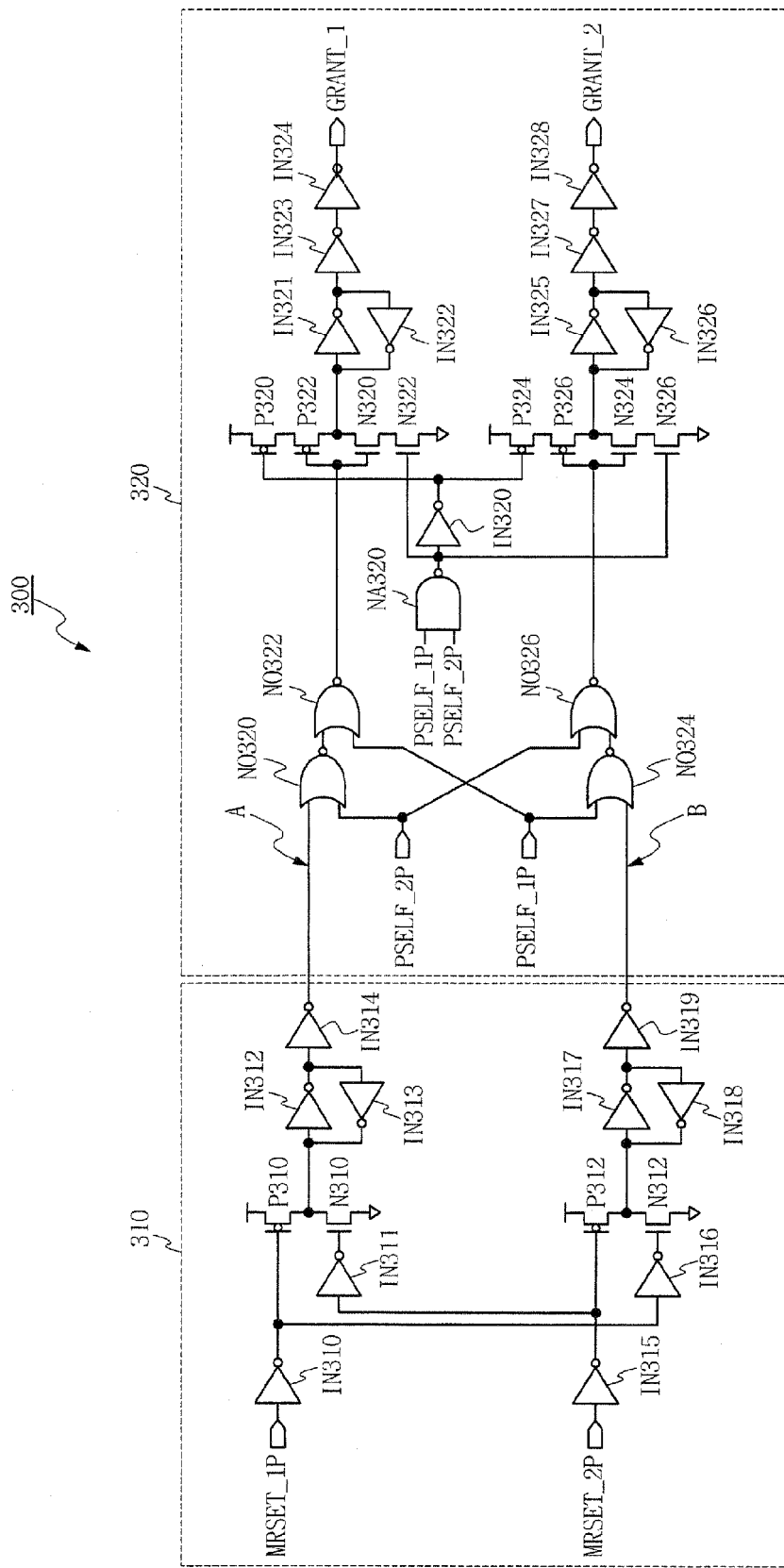
FIG. 7 is a circuit diagram of the embodiment illustrated in FIG. 4.

As shown in FIG. 4, the grant control block 300 operates in response to control signals MRSET_1P and MRSET_2P generated by an external command signal to change an access right (grant) for the B bank 190b and in response to signals PSELF_1P and PSELF_2P indicating a self refresh mode performed by the first input/output port and the second input/output port. The grant control block 300 generates grant control signals GRANT_1 and GRANT_2 to control an access right ("grant") for the B bank 190b in response to the signals MRSET_1P, MRSET_2P, PSELF_1P, and PSELF_2P. This functionality will be further described below when the circuit structure of FIG. 7 is described.

Figure 5:
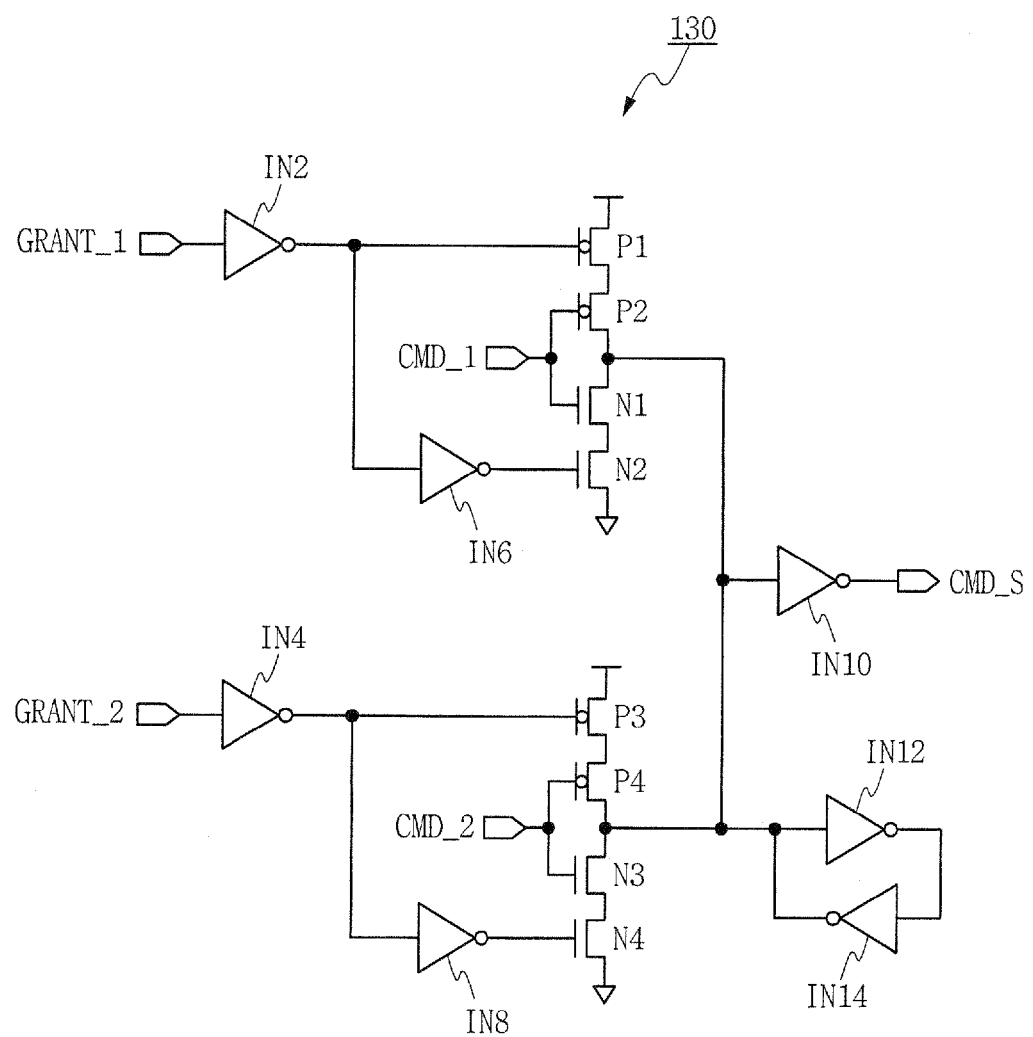
FIG. 5 is a circuit diagram of the first selecting unit illustrated in FIG. 2.

FIG. 5 is a circuit diagram of the first selecting unit 130 illustrated FIG. 2.

The first selecting unit 130 includes inverters IN2, IN4, IN6, IN8, IN10, IN12, and IN14, PMOS transistors P1, P2, P3, and P4, and NMOS transistors N1, N2, N3, and N4, as shown in FIG. 5.

As shown in FIG. 5, the first selecting unit 130 is controlled by the grant control signals GRANT_1 and GRANT_2 generated at the grant control block 300 of FIG. 4. For example, when the first grant control signal GRANT_1 for assigning a grant to the first input/output port is at a "high" level and the second grant control signal GRANT_2 for assigning a grant to the second input/output port is at "low" level, the following operation is performed. That is, when the first grant control signal GRANT_1 is at a "high" level, the PMOS transistor P1 and the NMOS transistor N2 are turned on. Accordingly, an inverter circuit including the NMOS transistor N1 and the PMOS transistor P2 operates and the command signal CMD_1 input via the first input/output port is output as the command signal CMD_S for the shared memory area. Further, since the second grant control signal GRANT_2 is at a "low" level, the PMOS transistor P3 and the NMOS transistor N4 are turned off and the command signal CMD_2 input via the second input/output port is blocked. In this manner, a grant that is an access right to access the B bank 190b as a shared memory area is assigned to the first input/output port.

Next, when the second grant control signal GRANT_2 for assigning a grant to the second input/output port is at a "high" level and the first grant control signal GRANT_1 for assigning a grant to the first input/output port is at "low" level, the following operation is performed. That is, when the second grant control signal GRANT_2 is at a "high" level, the PMOS transistor P3 and the NMOS transistor N4 are turned on. Accordingly, an inverter circuit including the NMOS transistor N3 and the PMOS transistor P4 operates and the command signal CMD_2 input via the second input/output port is output as the command signal CMD_S for the shared memory area. Further, since the first grant control signal GRANT_1 is at a "low" level, the PMOS transistor P1 and the NMOS transistor N2 are turned off and the command signal CMD_1 input via the first input/output port is blocked. In this manner, a grant that is an access right to access the B bank 190b as a shared memory area is assigned to the second input/output port.

Since the first selecting unit 130 shown in FIG. 5 is one example, it may be composed of a circuit capable of performing the operation described above.

Figure 6:
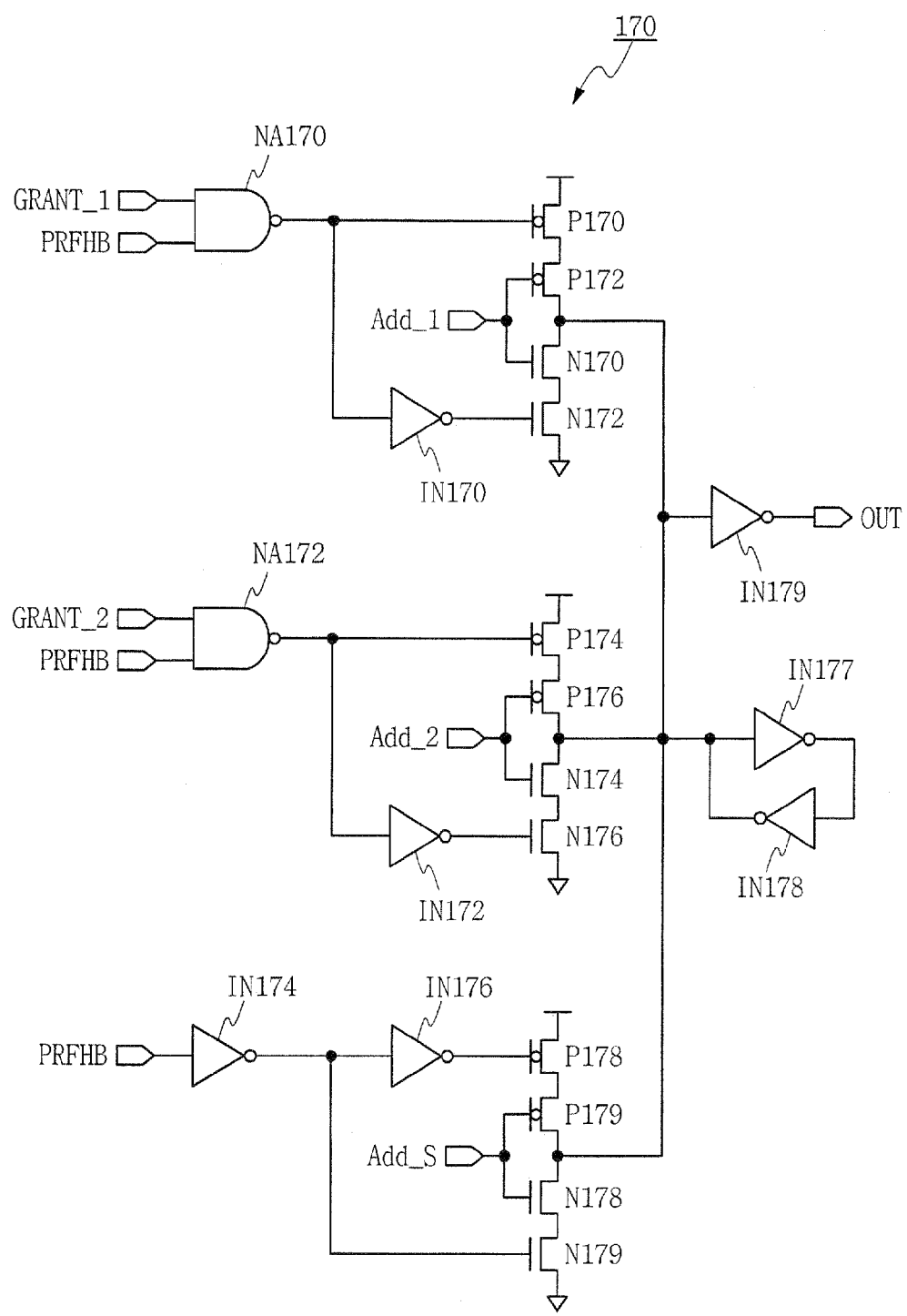
FIG. 6 is a circuit diagram of the second selecting unit illustrated in FIG. 3.

FIG. 6 illustrates the configuration of the second selecting unit 170 illustrated in FIG. 3.

The second selecting unit 170 includes NAND circuits NA170 and NA172, inverters IN170, IN172, IN174, IN176, IN177, IN178, and IN179, PMOS transistors P170, P172, P174, P176, P178, and P179, and NMOS transistors N170, N172, N174, N176, N178, and N179, as shown in FIG. 6.

As shown in FIG. 6, the second selecting unit 170 is controlled by the grant control signals GRANT_1 and GRANT_2 generated at the grant control block 300 illustrated in FIG. 4. The refresh enable signal PRFHB has a "low" level during refresh operation and a "high" level during other operations.

The second selecting unit 170 operates as follows: When the first grant control signal GRANT_1 for assigning a grant to the first input/output port is at a "high" level and the second grant control signal GRANT_2 for assigning a grant to the second input/output port is at "low" level, and when refresh is not enabled, the first grant control signal GRANT_1 is at a "high" level and a refresh enable signal PRFHB is at a "high" level. Accordingly, the output of the NAND circuit NA170 is at a "low" level and the PMOS transistor P170 and the NMOS transistor N172 are turned on. Accordingly, an inverter circuit including the NMOS transistor N170 and the PMOS transistor P172 operates and an address signal Add_1 input via the first input/output port is output as an address signal for the shared memory area. Further, since the second grant control signal GRANT_2 is at a "low" level, the PMOS transistor P174 and the NMOS transistor N176 are turned off and the address signal Add_2 input via the second input/output port is blocked. In this manner, a grant that is an access right for the B bank 190b as the shared memory area is assigned to the first input/output port. Further, since the refresh enable signal PRFHB is at a "high" level, the PMOS transistor P178 and the NMOS transistor N179 are turned off and the refresh address signal Add_S output via the third refresh counter (160c of FIG. 3) is blocked.

Next, when the second grant control signal GRANT_2 is at a "high" level, the first grant control signal GRANT_1 is at a "low" level, and the refresh enable signal PRFHB is at a "high" level, the second selecting unit 170 operates as follows. That is, as the second grant control signal GRANT_2 is at a "high" level and the refresh enable signal PRFHB is at a "high" level, an output of NAND circuit NA172 is at a "low" level. Accordingly, the PMOS transistor P174 and the NMOS transistor N176 are turned on. The inverter circuit including the NMOS transistor N174 and the PMOS transistor P176 operates and an address signals Add_2 input via the second input/output port is output as an address signal for the shared memory area. Further, since the first grant control signal GRANT_1 is at a "low" level, the PMOS transistor P170 and the NMOS transistor N172 are turned off and the address signals Add_1 input via the first input/output port is blocked. In this manner, a grant that is an access right to access the B bank 190b as the shared memory area is assigned to the second input/output port. Further, since the refresh enable signal PRFHB is at a "high" level, the PMOS transistor P178 and the NMOS transistor N179 are turned off and a refresh address signal Add_S output via the third refresh counter (160c of FIG. 3) is blocked.

Next, when the refresh enable signal PRFHB is enabled into a "low" level, only the refresh address signal Add_S output via the third refresh counter (160c of FIG. 3) is unconditionally output to the shared memory area irrespective of the grant control signals GRANT_1 and GRANT_2 so that refresh is performed.

Since the second selecting unit 170 shown in FIG. 6 is one example, it may be composed of any circuit capable of performing the operation described above.

FIG. 7 illustrates an example of the grant control block 300 illustrated in FIG. 4.

As shown in FIG. 7, the grant control block 300 includes a command control unit 310 and a self refresh control unit 320.

The command control unit 310 includes inverters IN310, IN311, IN312, IN313, IN314, IN315, IN316, IN317, IN318, and IN319, PMOS transistors P310 and P312, and NMOS transistors N310 and N312, as shown in FIG. 7.

The command control unit 310 is controlled by control signals MRSET_1P and MRSET_2P that are generated by a grant change command signal. For example, when a grant change command signal is applied to the first input/output port, the first of the control signals MRSET_1P and MRSET_2P becomes an auto pulse signal. That is, the first control signal MRSET_1P becomes an auto pulse signal that is kept at a "low" level and then at a "high" level during a predetermined time. When a grant change command signal is applied to the second input/output port, the second of the control signals MRSET_1P and MRSET_2P becomes an auto pulse signal. That is, the second control signal MRSET_2P is an auto pulse signal that is kept at a "low" level and then at a "high" level during a predetermined time and is returned to a "low" level.

When the second control signal MRSET_2P is kept at a "low" level and, at this time, the first control signal MRSET_1P becomes an auto pulse at a "high" level during a predetermined time, and the PMOS transistor P310 is turned on during the predetermined time. Accordingly, the output node A of the command control unit 310 is output at a "high" level. Further, the NMOS transistor N312 is turned on during a predetermined time and the node B is output at a "low" level. The node A is kept at a "high" level by a latch circuit including inverters IN312 and IN313, and the node B is kept at a "low" level by a latch circuit including inverters IN317 and IN318. The level of the nodes A and B is maintained until the grant change signal is applied to the second input/output port and the second control signal MRSET_2P becomes an auto pulse signal.

When the first control signal MRSET_1P is kept at a "low" level and, at this time, the second control signal MRSET_2P becomes an auto pulse signal at a "high" level during a predetermined time, the NMOS transistor N310 is turned on during the predetermined time and accordingly the node A of the command control unit 310 is changed to a "low" level. Further, the PMOS transistor P312 is turned on during the predetermined time. Accordingly, the node B is output at a "high" level, The node A is kept at a "low" level by the latch circuit including the inverters IN312 and IN313, and the node B is kept at a "high" level by the latch circuit including the inverters IN317 and IN318. The level of the node A and the node B is maintained until the grant change signal is applied to the first input/output port and the first control signal MRSET_1P become an auto pulse signal.

The self refresh control unit 320 includes NOR circuits N0320, N0322, N0324, and N0326, a NAND circuit NA320, inverters IN320, IN321, IN322, IN323, IN324, IN325, IN326, IN327, and IN328, PMOS transistors P320, P322, P324, and P326, and NMOS transistors N320, N322, N324, and N326, as shown in FIG. 7.

The self refresh control unit 320 is controlled by the signals PSELF_1P and PSELF_2P indicating a self refresh mode. It is assumed that when the first self refresh mode signal PSELF_1P is at a "high" level, a self refresh command is input via the first input/output port and the self refresh is performed. That is, it is assumed that the first input/output port is in a self refresh mode. It is also assumed that when the second self refresh mode signal PSELF_2P is at a "high" level, a self refresh command is input via the second input/output port and the self refresh is performed. That is, it is assumed that the second input/output port is in a self refresh mode.

The self refresh control unit 320 controls the grant control signals GRANT_1 and GRANT_2 in preference to the output signal of the command control unit 310. That is, even though the command control unit 310 outputs a signal to assign a grant to the first input/output port, a grant is assigned to the second input/output port through which the automatic refresh is performed when the first input/output port enters a self refresh mode. The same applies to the opposing case. However, when the signals PSELF_1P and PSELF_2P indicating the self refresh mode are at a "high" level, grant change is fundamentally blocked. This is because the NMOS transistors N322 and N326 and the PMOS transistors P320 and P324 constituting the self refresh control unit 320 are all turned off. When the signals PSELF_1P and PSELF_2P are at a "low" level, the grant is not changed by the self refresh control unit 320 but by the command control unit 310. Here, even when grant is changed by the self refresh control unit 320, the command control unit 310 operates. When the grant change command signal is input again, logic levels of the node A and the node B are changed. That is, the logic levels of the node A and the node B are continuously updated according to the grant change command signal.

In FIG. 7, the grant control block 300 changes the grant within the semiconductor memory device in the self refresh operation. If the semiconductor memory device is implemented so that the grant is changed before it enters the self refresh, it may be composed only of the command control unit 310 without requiring the self refresh control unit 320.

Since the grant control block 300 shown in FIG. 7 is one example, it may be composed of any circuit capable of performing the operation described above.

Operation of a semiconductor memory device including the grant control block 300 according to an embodiment of the present invention will now be described with reference to FIGS. 8 to 11.

FIGS. 8 to 11 are timing diagrams illustrating the operation of the semiconductor memory device including the grant control block 300 according to an embodiment of the present invention.

Figure 8:
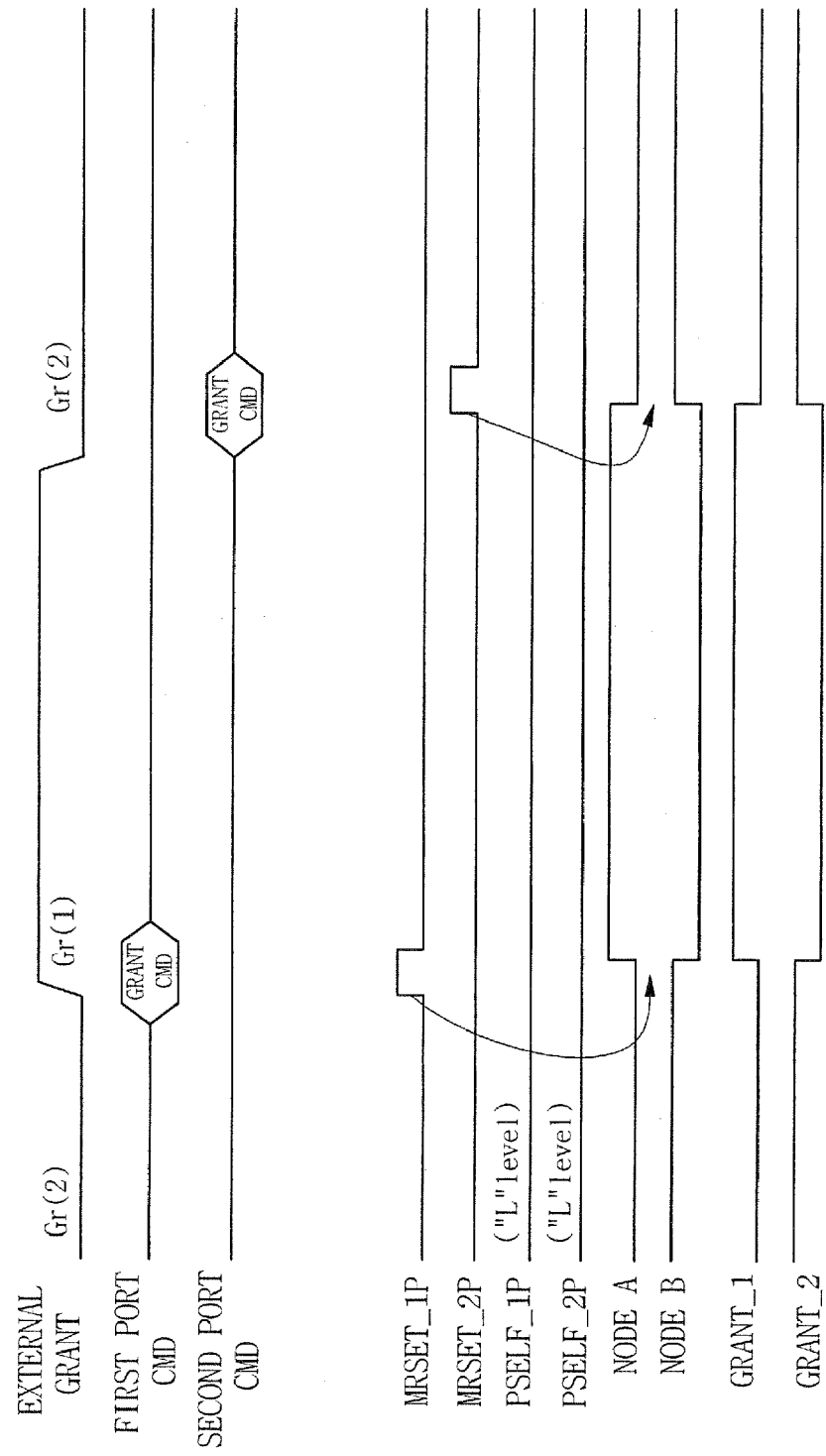
FIGS. 8 to 11 are timing diagrams illustrating an example of the operation of the embodiment illustrated in FIG. 1.

In FIG. 8, the device is in a normal mode of operation, in which it is assumed that the first input/output port and the second input/output port are not in a self refresh mode. That is, the first and second self refresh mode signals PSELF_1P and PSELF_2P are at a "low" level.

As shown in FIG. 8, initial values are values when a grant Gr(2) is assigned to the second input/output port in response to an external grant change command signal External Grant. In the grant control block 300, the node A is kept at a "low" level, and the node B is kept at a "high" level. Further, the first grant control signal GRANT_1P is kept at a "low" level, and the second grant control signal GRANT_2P is kept at a "high" level.

When an external grant change command signal External Grant is instructed to assign a grant to the first input/output port (i.e., generating External Grant as Gr(1)), a command signal GRANT CMD is input via the first input/output port. Accordingly, the first control signal MRSET_1P becomes an auto pulse signal and input to the grant control block 300. Since the second control signal MRSET_2P is kept at a "low" level, the node A is changed to and kept at a "high" level, and the node B is changed to and kept at a "low" level. Since the first and second self refresh mode signals PSELF_1P and PSELF_2P are at a "low" level, the first grant control signal GRANT_1 is changed to and kept at a "high" level and the second grant control signal GRANT_2 is changed to and kept at a "low" level. Accordingly, the grant is assigned to the first input/output port by the first selecting unit 130 and the second selecting unit 170, which are controlled by the first grant control signal GRANT_1 and the second grant control signal GRANT_2.

When the external grant change command signal External Grant is instructed to assign the grant to the second input/output port (i.e., generating External Grant as Gr(2)), a command signal GRANT CMD is input via the second input/output port. Accordingly, the second control signal MRSET_2P becomes an auto pulse signal and input to the grant control block 300. Since the second control signal MRSET_1P is kept at a "low" level, the node A is changed to and kept at a "low" level, and the node B is changed to and kept at a "high" level. Since the first and second self refresh mode signals PSELF_1P and PSELF_2P are at a "low" level, the first grant control signal GRANT_1 is changed to and kept at a "low" level and the second grant control signal GRANT_2 is changed to and kept as a "high" level. Accordingly, the grant is assigned to the second input/output port by the first selecting unit 130 and the second selecting unit 170, which are controlled by the first grant control signal GRANT_1 and the second grant control signal GRANT_2.

Figure 9:
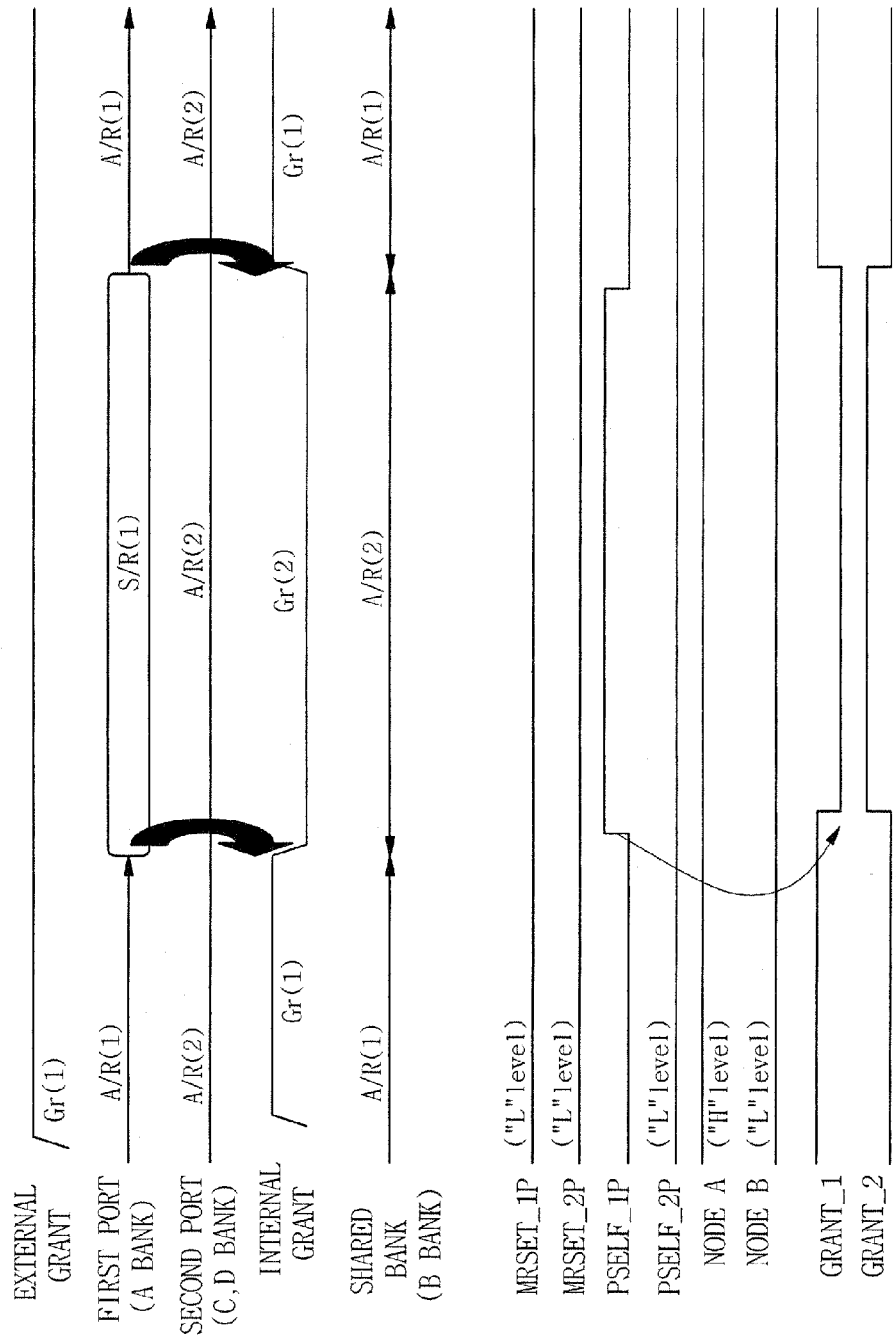

FIG. 9 illustrates a process when a grant is assigned to the first input/output port and the first input/output port enters a self refresh mode.

As shown in FIG. 9, initially, a grant Gr(1) is assigned to the first input/output port in response to an external grant change command signal External Grant. In the grant control block 300, the node A is kept at a "high" level and the node B is kept at a "low" level. Further, the first grant control signal GRANT_1P is kept at a "high" level, and the second grant control signal GRANT_2P is kept at a "low" level. At this time, the grant Gr(1) is also assigned to the first input/output port in response to an Internal Grant. The Internal Grant refers to a grant determined by internal operation of the semiconductor memory device in preference to the external grant change command signal External Grant external to the semiconductor memory device.

The first input/output port and the second input/output port are in an automatic refresh mode A/R. Accordingly, the B bank 190a that is the shared memory area is refreshed in an automatic refresh mode A/R(1) by the first input/output port.

A process when the first input/output port then enters a self refresh mode S/R will now be described below.

When the first input/output port enters the self refresh mode S/R, the first self refresh mode signal PSELF_1P is changed to a "high" level while the node A is kept at a "high" level and the node B is kept at a "low" level. The second self refresh mode signal PSELF_2P is kept at a "low" state.

Since the first self refresh mode signal PSELF_1P is at a "high" level and the second self refresh mode signal PSELF_2P is at a "low" level, the first grant control signal GRANT_1 is changed to and kept at a "low" level and the second grant control signal GRANT_2 is changed to and kept at a "high" level irrespective of the logic states of the nodes A and B.

Accordingly, a grant GR(2) is internally assigned to the second input/output port by the first selecting unit 130 and the second selecting unit 170, which are controlled by the first grant control signal GRANT_1 and the second grant control signal GRANT_2. Thus, the B bank 190a that is the shared memory area is refreshed in an automatic refresh mode A/R (2) by the second input/output port.

When the first input/output port is released from the self refresh mode S/R and enters the automatic refresh mode A/R, the node A and the node B of the grant control block 300 are kept at an initial logic state and accordingly an initial state is returned by the logic states of the nodes A and B. That is, since the node A is kept at a "high" level and the node B is kept at a "low" level, the first grant control signal GRANT_1P is changed to and kept at a "high" level and the second grant control signal GRANT_2P is changed to and kept at a "low" level. Accordingly, the grant Gr(1) is assigned to the first input/output port in response to the Internal Grant. Thus, the B bank 190a that is the shared memory area is refreshed in the automatic refresh mode A/R(1) by the first input/output port.

Figure 10:
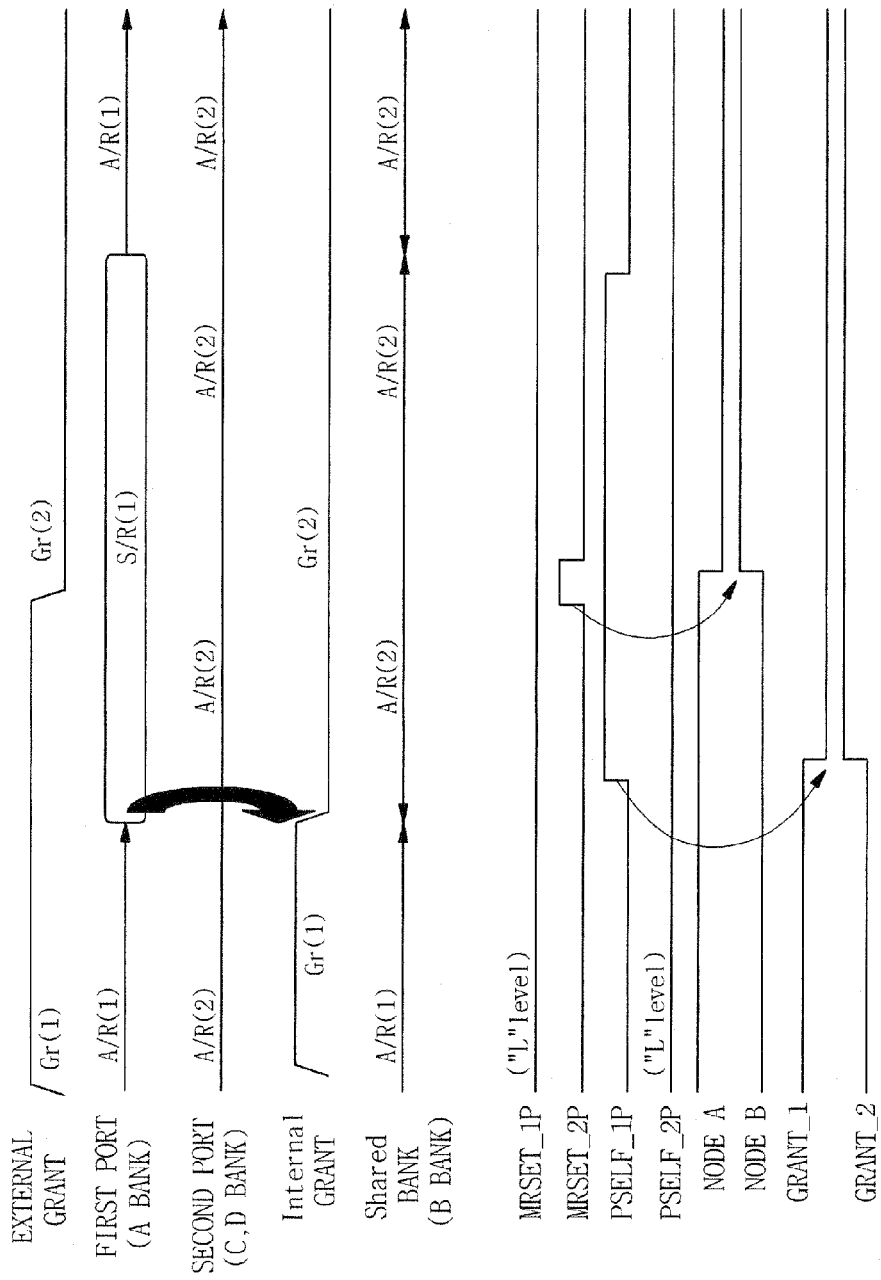

FIG. 10 illustrates a process when an external grant change command signal External Grant instructing to change a grant GR(2) to the second input/output port during a self refresh mode (as shown in FIG. 9) is input.

As shown in FIG. 10, the grant Gr(1) is initially assigned to the first input/output port in response to an external grant change command signal External Grant. In this case, the node A of the grant control block 300 is kept at a "high" level, and the node B is kept at a logic "low" level. Further, the first grant control signal GRANT_1P is kept at a "high" level, and the second grant control signal GRANT_2P is kept at a "low" level. At this time, the grant Gr(1) is assigned to the first input/output port in response to the Internal Grant. The first input/output port and the second input/output port are in the automatic refresh mode A/R. Accordingly, the B bank 190a that is the shared memory area is refreshed in an automatic refresh mode A/R(1) by the first input/output port.

The first input/output port then enters a self refresh mode S/R.

When the first input/output port enters the self refresh mode S/R, the first self refresh mode signal PSELF_1P is changed to a "high" level while the node A is kept at a "high" level and the node B is kept at a "low" level. The second self refresh mode signal PSELF_2P is kept at a "low" state.

Since the first self refresh mode signal PSELF_1P is at a "high" level and the second self refresh mode signal PSELF_2P is at a "low" level, the first grant control signal GRANT_1 is changed to and kept at a "low" level and the second grant control signal GRANT_2 is changed to and kept at a "high" level irrespective of the logic states of the nodes A and B.

Accordingly, the grant GR(2) is internally assigned to the second input/output port by the first selecting unit 130 and the second selecting unit 170, which are controlled by the first grant control signal GRANT_1 and the second grant control signal GRANT_2. Thus, the B bank 190a that is the shared memory area is refreshed in an automatic refresh mode A/R (2) by the second input/output port.

Thereafter, an external grant change command signal External Grant instructing to change grant GR(2) to the second input/output port is input while the first input/output port is kept at the self refresh mode S/R. In this case, the second control signal MRSET_2P becomes an auto pulse signal and input to the grant control block 300. Since the second control signal MRSET_1P is kept at a "low" level, the node A is changed to and kept at a "low" level and the node B is updated to and kept at a "high" level.

The updated logic states of the node A and the node B do not affect the change in the logic states of the first grant control signal GRANT_1 and the second grant control signal GRANT_2. This is because the logic states of the first self refresh mode signal PSELF_1P and the second self refresh mode signal PSELF_2P are set to preferentially affect the change in logic states of the first grant control signal GRANT_1 and the second grant control signal GRANT_2. Accordingly, the logic states of the first grant control signal GRANT_1 and the second grant control signal GRANT_2 are kept unchanged, and the grant GR(2) is assigned to the second input/output port in response to the Internal Grant. Accordingly, the B bank 190a that is the shared memory area is refreshed in an automatic refresh mode A/R(2) by the second input/output port.

Thereafter, when the first input/output port is released from the self refresh mode S/R and enters the automatic refresh mode A/R, the nodes A and B of the grant control block 300 are kept at an updated state different from an initial logic state and accordingly the updated logic state is used. That is, since the node A is kept at a "low" level and the node B is kept at a "high" level, the first grant control signal GRANT_1P is kept at a "low" level and the second grant control signal GRANT_2P is kept at a "high" level. Accordingly, the grant Gr(2) is assigned to the second input/output port in response to the Internal Grant. Accordingly, the B bank 190a that is the shared memory area is refreshed in an automatic refresh mode A/R(2) by the second input/output port.

Figure 11:
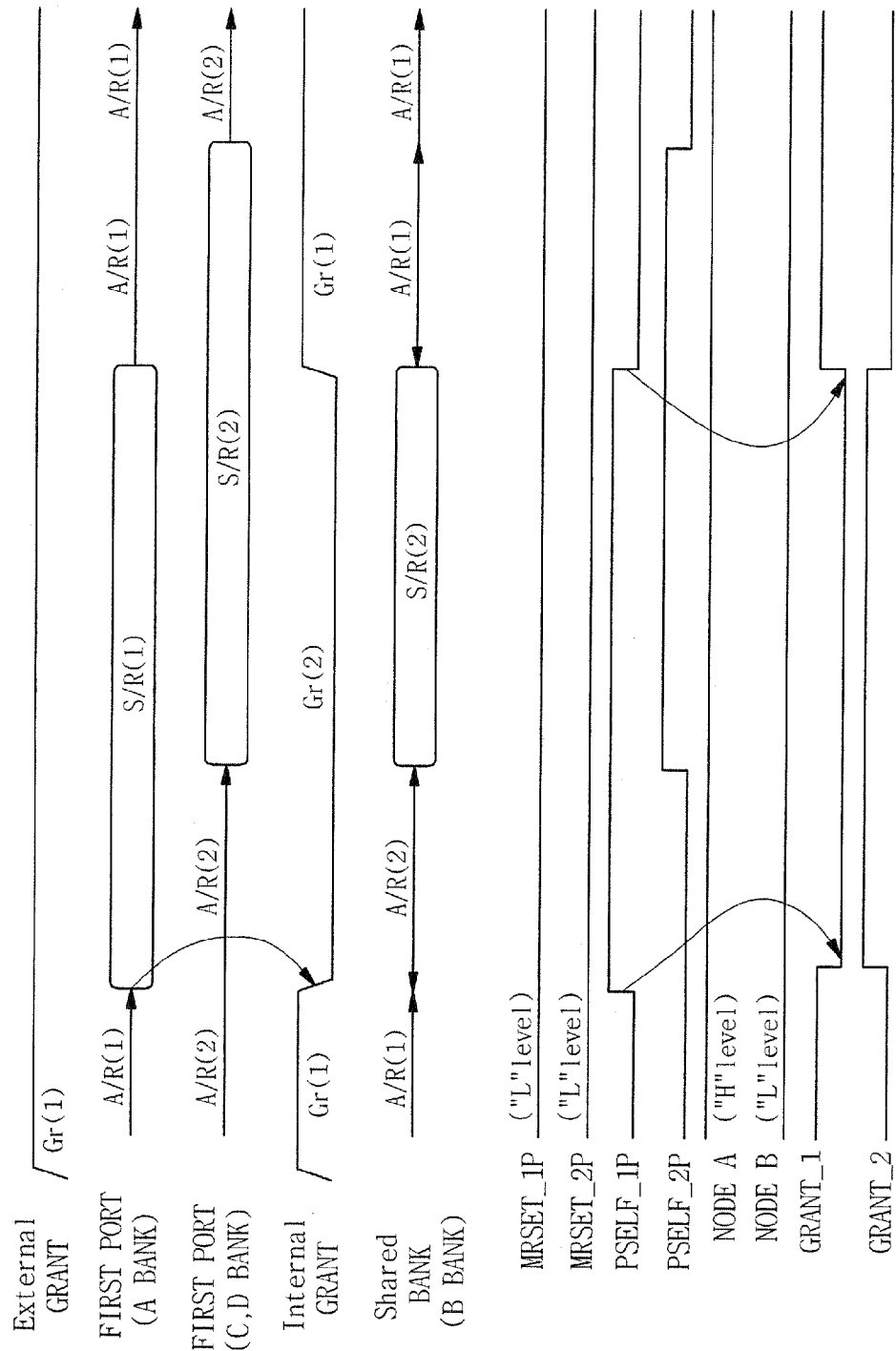

FIG. 11 illustrates a process when the second input/output port also enters a self refresh mode S/R during a self refresh mode S/R by the first input/output port (as shown in FIG. 9).

As shown in FIG. 11, processes from the initial process to the process of entering the self refresh mode S/R by the first input/output port are the same as those in FIG. 9. That is, the first grant control signal GRANT_1 is changed to and kept at a "low" level and the second grant control signal GRANT_2 is changed to and kept at a "high" level irrespective of the logic states of the nodes A and B.

Accordingly, the grant GR(2) is assigned to the second input/output port in response to an Internal Grant by the first selecting unit 130 and the second selecting unit 170, which are controlled by the first grant control signal GRANT_1 and the second grant control signal GRANT_2. Thus, the B bank 190a that is the shared memory area is refreshed in the automatic refresh mode A/R(2) by the second input/output port.

Thereafter, the second input/output port enters the self refresh mode S/R while the first input/output port is kept in the self refresh mode S/R. In this case, the first and second self refresh mode signals PSELF_1P and PSELF_2P are both at a "high" level, in which the grant change is blocked. Accordingly, the first grant control signal GRANT_1 is kept at a previous "low" level and the second grant control signal GRANT_2 is kept at a previous "high" level. Thus, even in this case, the B bank 190a that is the shared memory area is refreshed in the automatic refresh mode A/R(2) by the second input/output port.

Thereafter, when the first input/output port is released from the self refresh mode S/R and enters the automatic refresh mode A/R, the nodes A and B of the grant control block 300 are kept at an initial logic state and accordingly an initial state is returned in response to the logic states of the node A and the node B. That is, since the node A is kept at a "high" level and the node B is kept at a "low" level, the first grant control signal GRANT_1P is changed to and kept at a "high" level and the second grant control signal GRANT_2P is changed to and kept at a "low" level. Accordingly, the grant Gr(1) is assigned to the first input/output port in response to the Internal Grant. Thus, the B bank 190a that is the shared memory area is refreshed in the automatic refresh mode A/R I by the first input/output port.

The operations illustrated in FIGS. 8 to 11 are merely for assisting in understanding the semiconductor memory device and the method therefor according to an embodiment of the present invention. Different operations are possible, which will be easily understood by those skilled in the art from the operations illustrated in FIGS. 8 to 11.

Meanwhile, even though the invention has been described using exemplary embodiments, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

As described above, according to the present invention, it is possible to change the access right (grant) to access the shared memory area according to a refresh mode in preference to the external command, thereby performing efficient operation on the shared memory area. That is, normal read or write operation and refresh operation are more efficiently performed.

What is claimed is:

1. A semiconductor memory device comprising:
   a plurality of input/output ports for applying first or second mode refresh operation command signals;
   a memory array divided into a plurality of different memory areas, wherein at least one of the memory areas is a shared memory area that is accessible via at least two of the plurality of input/output ports, the memory array being divided into a plurality of different memory areas; and
   a grant control block arranged to generate grant control signals for assigning an access right to one of the plurality of input/output ports to access the shared memory area in response to an external command signal, wherein the grant control block generates grant control signals for reassigning the access right to an input/output port applying the first mode refresh operation command signal when the input/output port currently assigned the access right by the external command signal applies the second mode refresh operation command signal.

2. The device according to claim 1, wherein the first mode is an automatic refresh mode, and the second mode is a self refresh mode.

3. The device according to claim 1, wherein the semiconductor memory device is a dual-port semiconductor memory device having first and second input/output ports.

4. The device according to claim 3, wherein the memory array comprises:
   a first memory area that is accessible only via the first input/output port;
   a second memory area that is accessible only via the second input/output port; and
   a third memory area that is accessible via the first and second input/output ports.

5. The device according to claim 1, wherein the grant control block generates grant control signals for reassigning the access right the original input/output port indicated as having the access right by the external command signal when the original input/output port changes from applying the second mode refresh command signal to applying the first mode refresh command signal.

6. The device according to claim 4, wherein the semiconductor memory device further comprises:
   a first selecting unit for arbitrating the command signals input via the first input/output port and the second input/output port for access of the shared memory area; and
   a second selecting unit for arbitrating address signals input via the first input/output port and the second input/output port for access of the shared memory area and transmitting a separate refresh address to the shared memory area in the refresh operation.

7. The device according to claim 6, wherein the first selecting unit operates in response to the grant control signals, and the second selecting unit operates in response to the grant control signals and the refresh operation signal.

8. A semiconductor memory device comprising:
   a memory array divided into first, second, and third memory areas; and
   a refresh control circuit for controlling the first and second memory areas to be refreshed in a first or second mode in response to separately refresh command signals, controlling the third memory area to be refreshed in the first mode when at least one of the first memory area and the second memory area is refreshed in the first mode, and controlling the third memory area to be refreshed in the second mode when both of the first memory area and the second memory area are refreshed in the second mode.

9. The device according to claim 8, wherein the semiconductor memory device is a dual-port semiconductor memory device having first and second input/output ports.

10. The device according to claim 9, wherein the first memory area is accessible only via the first input/output port, the second memory area is accessible only via the second input/output port, and the third memory area is accessible via the first and second input/output ports.

11. The device according to claim 8, wherein the first mode is an automatic refresh mode, and the second mode is a self refresh mode.

12. The device according to claim 8, wherein the refresh control circuit further comprises a separate refresh counter for refresh of the third memory area only.

13. In a multi-port semiconductor memory device comprising at least one shared memory area accessible via at least two input/output ports arranged to apply first or second mode refresh operation command signals, a method for assigning an access right to access the shared memory area comprising:
   assigning an access right to access the shared memory area to a specific input/output port in response to an external command signal; and
   changing the access right to access the shared memory area to another input/output port applying the first mode refresh operation command signal, when the specific input/output port indicated by the external command signal applies the second mode refresh operation command signal.

14. The method according to claim 13, wherein the first mode is an automatic refresh mode, and the second mode is a self refresh mode.

15. The method according to claim 14, wherein the semiconductor memory device is a dual-port semiconductor memory device having first and second input/output ports.

16. In a semiconductor memory device including a memory array divided into first, second, and third memory areas, a method for refreshing the memory areas comprising:
   refreshing the first and second memory areas in a first or second mode in response to separately input refresh command signals;

refreshing the third memory area in the first mode when at least one of the first memory area and the second memory area is refreshed in the first mode; and refreshing the third memory area in the second mode when both of the first memory area and the second memory area are refreshed in the second mode.

17. The method according to claim 16, wherein the semiconductor memory device is a dual-port semiconductor memory device having first and second input/output ports.

18. The method according to claim 17, wherein the first memory area is accessible only via the first input/output port, the second memory area is accessible only via the second input/output port, and the third memory area is accessible via the first and second input/output ports.

19. The method according to claim 16, wherein the first mode is an automatic refresh mode, and the second mode is a self refresh mode.

20. The method according to claim 16, wherein the refreshing of the third memory area is performed by a separate refresh counter for refresh of the third memory area only.

* * * * *

UNITED STATES PATENT AND TRADEMARK OFFICE
CERTIFICATE OF CORRECTION

| | | |
|---|---|---|
| PATENT NO. | : 7,394,711 B2 | Page 1 of 1 |
| APPLICATION NO. | : 11/616846 | |
| DATED | : July 1, 2008 | |
| INVENTOR(S) | : Chi-Sung Oh et al. | |

It is certified that error appears in the above-identified patent and that said Letters Patent is hereby corrected as shown below:

Column 6, line 27, the word "MRSET_1P." should read -- MRSET_1P, --;
Column 8, line 59, the words "level, The" should read -- level. The --;
Column 8, line 67, the words "N0320, N0322, N0324, and N0326," should read -- NO320, NO322, NO324, and NO326, --;
Column 13, line 3, the words "A/R I" should read -- A/R 1 --;
Column 13, line 63, the words "right the" should read -- right to the --;
Column 14, line 20, the word "separately" should read -- separate --.

Signed and Sealed this

Seventh Day of October, 2008

JON W. DUDAS
*Director of the United States Patent and Trademark Office*